(12) United States Patent
Joshi et al.

(10) Patent No.: US 10,734,966 B2
(45) Date of Patent: Aug. 4, 2020

(54) PHASE SHIFTER FOR GIGA HERTZ INTEGRATED CIRCUITS

(71) Applicant: Steradian Semiconductors Private Limited, Bangalore (IN)

(72) Inventors: Alok Prakash Joshi, Thane (IN); Gireesh Rajendran, Bangalore (IN); Rakesh Kumar, Bangalore (IN)

( * ) Notice: Subject to any disclaimer, the term of this patent is extended or adjusted under 35 U.S.C. 154(b) by 305 days.

(21) Appl. No.: 15/935,086

(22) Filed: Mar. 26, 2018

(65) Prior Publication Data

US 2019/0229699 A1    Jul. 25, 2019

(51) Int. Cl.
| | | |
|---|---|---|
| *G01S 7/03* | (2006.01) | |
| *G01S 7/41* | (2006.01) | |
| *G01S 13/06* | (2006.01) | |
| *G01S 13/02* | (2006.01) | |
| *H03H 7/19* | (2006.01) | |
| *H01L 49/02* | (2006.01) | |
| *H01L 23/66* | (2006.01) | |
| *H01L 23/522* | (2006.01) | |
| *H04B 1/38* | (2015.01) | |
| *H01Q 21/00* | (2006.01) | |

(52) U.S. Cl.
CPC ............. *H03H 7/19* (2013.01); *G01S 7/03* (2013.01); *G01S 7/41* (2013.01); *G01S 13/06* (2013.01); *H01L 23/66* (2013.01); *H01L 28/10* (2013.01); *H01L 28/20* (2013.01); *H01L 28/40* (2013.01); *G01S 2013/0254* (2013.01); *H01L 23/5223* (2013.01); *H01L 23/5226* (2013.01); *H01L 23/5227* (2013.01); *H01L 23/5228* (2013.01); *H01L 2223/6677* (2013.01); *H01Q 21/00* (2013.01); *H04B 1/38* (2013.01)

(58) Field of Classification Search
CPC .......... G01S 13/02; G01S 13/06; G01S 13/42; G01S 2013/0254; G01S 2013/0263; G01S 7/03; G01S 7/032; G01S 7/41; H01L 2223/6677; H01L 23/5223; H01L 23/5226; H01L 23/5227; H01L 23/5228; H01L 23/66; H01L 28/10; H01L 28/20; H01L 28/40; H01Q 21/00; H03H 2001/0064; H03H 2001/0078; H03H 7/06; H03H 7/19; H03H 7/20; H04B 1/38
See application file for complete search history.

(56) References Cited

U.S. PATENT DOCUMENTS

| | | | |
|---|---|---|---|
| 2002/0118066 A1* | 8/2002 | Lautzenhiser | .......... H03F 1/301 330/295 |
| 2015/0026847 A1* | 1/2015 | Pai | .......... G01Q 60/16 850/29 |
| 2017/0133999 A1* | 5/2017 | Ishizuka | .......... H03H 7/18 |

* cited by examiner

*Primary Examiner* — Timothy X Pham

(57) ABSTRACT

According to an aspect of present disclosure, a phase shifter for providing a desired phase shift to a very high frequency signal fabricated as part of the an integrated circuit comprises a first coil segment and a second coil segment together forming an inductor of first inductance value, a first capacitor of first capacitance value electrically connected parallel the inductor, a second capacitor of second capacitance value electrically connected between the first coil segment and the second coil segment and a resistor of a first resistance value electrically connected parallel to the second capacitor, in that, the inductor, first capacitor, second capacitor and the resistor together operative as a phase shifter such that when a input signal of a first frequency is presented across the first capacitor, the output signal across the resistor is phase shifted version of the input signal shifted in phase by a first angle.

5 Claims, 4 Drawing Sheets

PHASE SHIFTER FOR GIGA HERTZ INTEGRATED CIRCUITS

CROSS REFERENCES TO RELATED APPLICATIONS

This application claims priority from Indian patent application No. 201841002431 filed on Jan. 20, 2018 which is incorporated herein in its entirety by reference.

BACKGROUND

Technical Field

Embodiments of the present disclosure relate generally to a passive component in an integrated circuit and more specifically to a phase shifter for Giga Hertz integrated circuits.

Related Art

An integrated circuit for processing Giga Hertz signal for transmission or reception requires performing phase shift operation on the integrated circuit chip. Conventional digital implementation like (clock) divider suffers from the switching time and hence is generally limited to sub Gigahertz implementations and is limited to sub 10 GHz frequency in most advanced semiconductor processes. Other conventional techniques like transmission line, transmission line loaded with capacitors, lumped elements delay lines etc., suffers from at least one of gain, and amplitude mismatch, high area with low loss, high loss with low area.

SUMMARY

According to an aspect of present disclosure, a phase shifter for providing a desired phase shift to a very high frequency signal fabricated as part of the an integrated circuit comprises a first coil segment and a second coil segment together forming an inductor of first inductance value, a first capacitor of first capacitance value electrically connected parallel the inductor, a second capacitor of second capacitance value electrically connected between the first coil segment and the second coil segment and a resistor of a first resistance value electrically connected parallel to the second capacitor, in that, the inductor, first capacitor, second capacitor and the resistor together operative as a phase shifter such that when a input signal of a first frequency is presented across the first capacitor, the output signal across the resistor is phase shifted version of the input signal shifted in phase by a first angle.

Several aspects are described below, with reference to diagrams. It should be understood that numerous specific details, relationships, and methods are set forth to provide a full understanding of the present disclosure. One who skilled in the relevant art, however, will readily recognize that the present disclosure can be practiced without one or more of the specific details, or with other methods, etc. In other instances, well-known structures or operations are not shown in detail to avoid obscuring the features of the present disclosure.

DETAILED DESCRIPTION OF THE PREFERRED EXAMPLES

Figure 1:
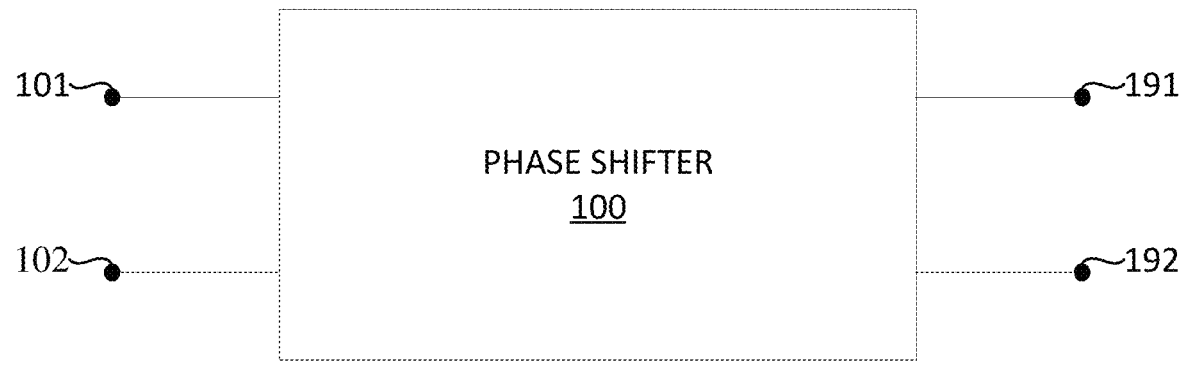
FIG. 1 is a phase shifter in an embodiment.
The FIG. 2 is a graph illustrating an example differential input and the corresponding differential output signal.
Figure 2:
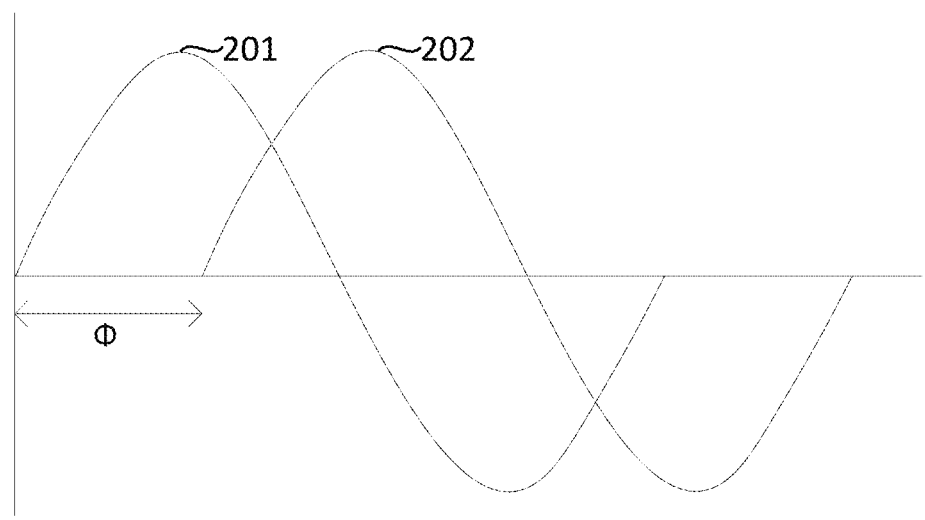

FIG. 1 is a phase shifter in an embodiment. The phase shifter 101 receives differential input analog signal between terminal 101 and 102 and provides a differential output signal between the terminal 191 and 192 that is shifted in phase with respect to the differential input analog signal. The FIG. 2 is a graph illustrating an example differential input signal between the terminal 101 and 102 and the corresponding differential output signal between the terminal 191 and 192. As shown there the analog output differential signal is delayed or phase shifted by an angle $\varphi$.

Figure 3:
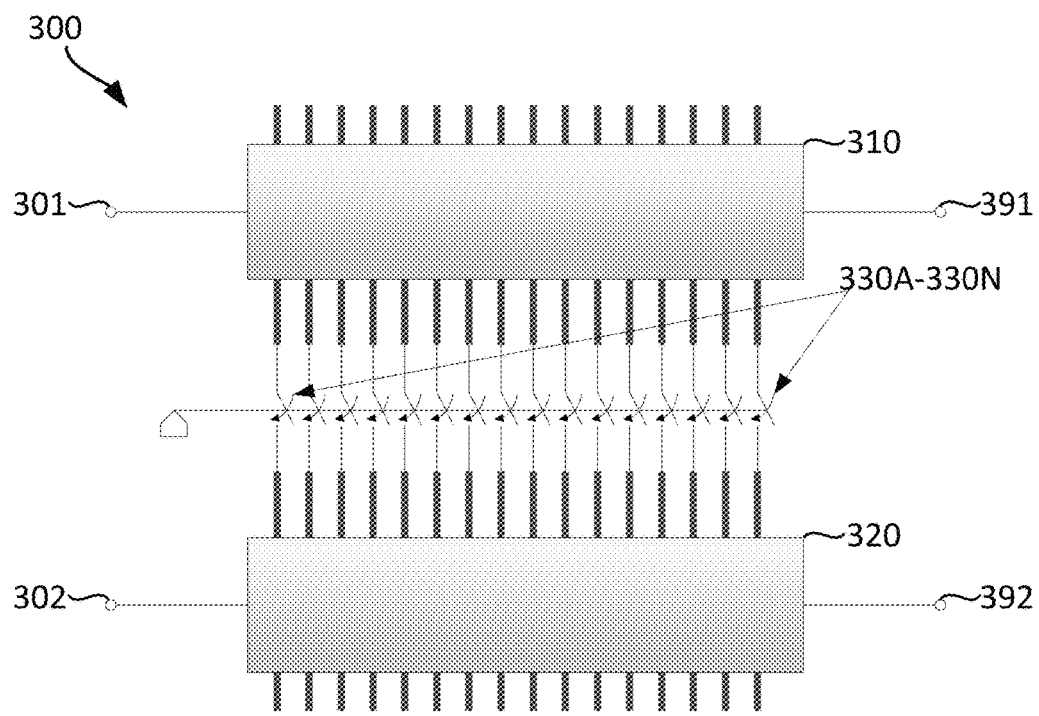
FIG. 3 is a conventional phase shifter.

FIG. 3 is a conventional phase shifter. The conventional DiCAD (digitally controlled artificial dielectric) phase shifter 301 is shown with conductive strip 310 and 320 forming transmission line 330. The input analog signal is provided on terminal 301 and 302 while the phase shifted output analog signal is provided on path 191 and 192. The length of the conductive strips 310 and 320 required to be set to at least quarter of the input analog signal wavelength. The digitally switchable capacitors 330A-330N loaded to the transmission line to an extent reduce overall length of the transmission line. The conventional DiCAD phase shifter suffers from amplitude mismatch with achievable maximum characteristic impedance being limited due to higher capacitance load.

Figure 4:
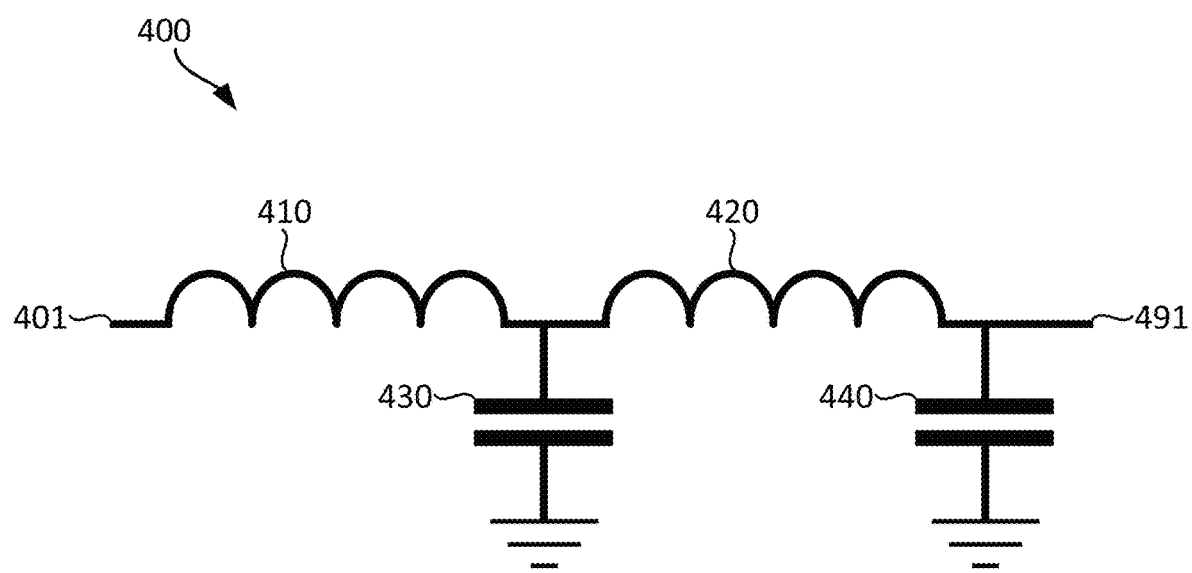
FIG. 4 is another conventional phase shifter.

FIG. 4 is another conventional phase shifter. The conventional lumped L (inductor) and C (capacitor) network phase shifter 401 is shown with lumped inductors 410 and 420 and capacitors 430 and 440 forming phase shifter network. The input analog signal is provided on terminal 401 and the phase shifted output analog signal is provided on path 491. Due to the deployment of lumped elements, conventional phase shifter 401 overcomes the requirement of minimum length for Giga hertz operation. However, the phase shifter 401 suffers from increased silicon area due to multiple inductors and increased routing lengths to achieve the desired delay.

Figure 5:
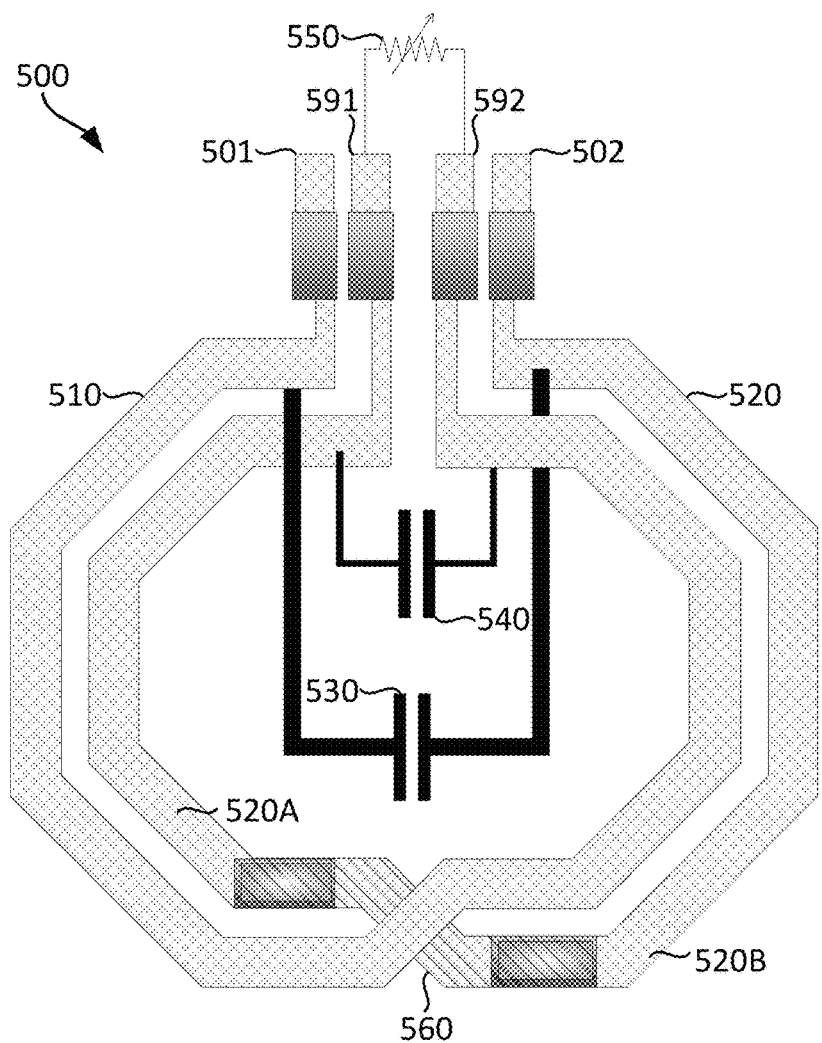
FIG. 5 is an example phase shifter in one embodiment.

FIG. 5 is an example phase shifter in one embodiment. The phase shifter 500 is conductive coil segments 510 and 520, capacitors 530 and 540, resistor 550, terminals 501, 502, 591 and 592, and via path 560. Each element is further described below.

Conductive coil segments 510 and 520, together form an inductor coil of a desired inductance value. The coil segments 510 and 520 are formed on any one of the metal layer or semiconductor layer of an integrated circuit. The coil segment 510 may be completely formed on one layer while the coil segment 520 is formed with help of via path 560 to provide a looping effect. In that, via path 560 is formed on different layer connecting the two parts 520A and 520B of coil segment 520. The conductive coil segments 510 and 520 are looped such that the magnetic flux linkage is maximum between the two segments. In one embodiment, the two segments 510 and 520, one coiling over other may be formed on a single metal layer closely etched in a hexagonal closed loop. In particular, the complete segment 510 and the non over lapping parts 520A and 520B of segment may be etched on single layer while the overlapping part of segment 520 (560) may be etched on immediate next mettle layer and connected to segment part 520A and 520B through via 560. Alternately, segment 510 and segment 520 may be etched one over other on two metal layers that are immediate or next to each other to provide maximum flux linkage. In one embodiment the, dimensions of the segments 510 and 520 may be selected to match the required inductance value. For example, the combined area of the segments 510 and 520, and the length of the etched metal part of the segment 510 and 520 may be adjusted to obtain the desired inductance value.

The capacitor 530 is fabricated across the inductance formed by segments 510 and 520. The capacitor 540 is fabricated between the coil segment 510 and 520. Value of the capacitors 530 and 540 are selected for desired phase shift. The capacitor 530 and 540 may be formed on any layer of the integrated circuit using any know ways and may be coupled to the terminals 501, 502, 591, and 592 as shown with the help of vias and conductive paths on metal lalyers.

The resistor element 550 is coupled across the capacitor 540 (between the terminals 502 and 592). The value of the resistance may be varied dynamically after the fabrication. Accordingly, the resistors may be fabricated as plurality of resistance elements (dielectric and conductor strips) that may be digitally connected (switched) in parallel or in series to obtain desired resistance between the terminal 502 and 592.

The conductive coil segments 510 and 520, capacitors 530 and 540, resistor 550, terminals 501, 502, 591 and 592, and via path 560 form phase shifter. In that, differential signal between the terminal 502 and 591 is phase shifted version of a differential analog signal coupled to the terminal 501 and 592. Due to use of one inductor element, the phase shifter 500 may be implemented with lesser area compared to conventional techniques. The manner in which desired phase shift with a reduced gain mismatch may be obtained is further described below.

Figure 6:
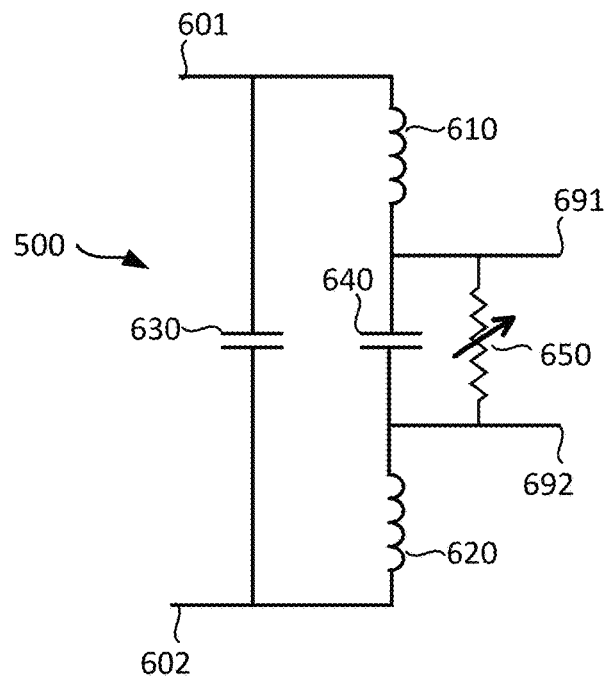
FIG. 6 is a circuit illustrating example operation of phase shifter.

FIG. 6 is a circuit illustrating example operation of phase shifter 500. The circuit is shown comprising inductors 610 and 620, capacitors 630 and 640 and the resistor 650. The inductors 610 and 620 offer an inductance of "L" Henry each. Similarly, the capacitors 630 and 640 offer a capacitance of C farads each. In one embodiment, the inductance of the inductors 610 and 620 may be constructed to offer different inductance values and capacitors 630 and 640 may also be constructed to offer different capacitance values instead of being equal. As a result, the impedance offered by the elements 610 and 620 are $X_L$ each, and that of elements 630 and 640 are $X_c$ each. The resistor 550 offers a resistance of R Ohms.

When a signal of $V_{in}$ voltage is provided between the terminals 601 and 602, the voltage between the terminals 691 and 692 ($V_{out}$) may be represented by relation:

$$V_{out} = V_{in} * \frac{R - jX_c}{(R - jX_c) + 2X_L} \quad (1)$$

In one embodiment, the $X_L$ is set to equal to $X_c$ for a Giga Hertz signal. Thus, from relation (1) magnitude (voltage) between terminals 691 and 692 $V_{out}$ is equal to $V_{in}$. Thus, amplitude imbalance is reduced. Further, the phase angle between $V_{out}$ and $V_{in}$ is represented by relation:

$$\varphi = \tan^{-1} \frac{(1 - jQ)}{(1 + jQ)} \quad (2)$$

in that, Q is equal to R/($X_c = X_L = X$). Accordingly, the phase shift produced between the terminal 691 and 692 with respect to terminals 601 and 602 is 90 degrees. The impedance offered between the terminals 691 and 692 is matched to (R*(1+Q²)).

Figure 7:
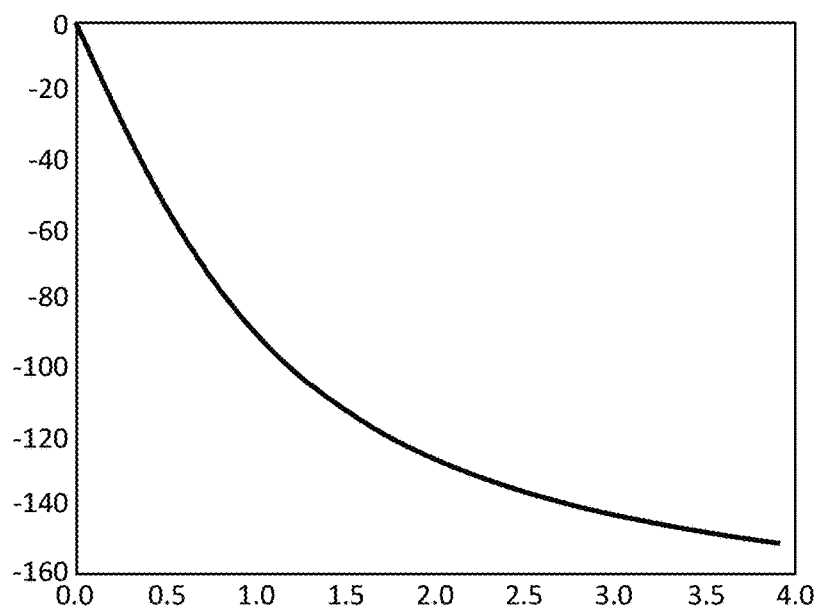
FIG. 7 is a graph illustrating the phase shift achieved for different Q values (R/X ratio).

Thus, the phase shifter 500 produces a phase shifted signal without any amplitude imbalance. Further, the phase shifter 500 may be realized with lowest area since only area required for one inductor coil is exploited. FIG. 7 is a graph illustrating the phase shift achieved for different Q values (R/X ratio). As may be seen, a phase shift of up to 180 degrees may be achieved by adjusting the R and X values in the phase shifter 500. Though, the phase shifter 500 is described with respect to differential signals, the similar performance may be obtained for the single ended signals by connecting one of the terminals (both at input and output) a reference potential (say ground potential). The manner in which the phase shifter 500 may be integrated on a radar sensing integrated circuit is further described below.

Figure 8:
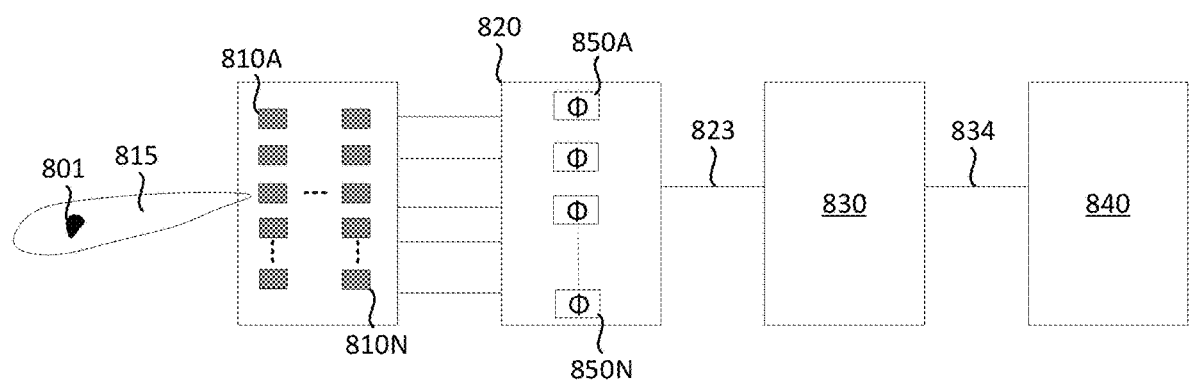
FIG. 8 is an example object detection system.

FIG. 8 is an example object detection system. The object detection system is shown comprising antenna array 810A-810N, beam steering unit 820, transceiver 830, and object detection unit 840. The beam steering unit is shown comprising phase shifter 850A through 850N. Each block is described below in further details.

The antenna array 810A-810N transmits signal effectively forming a beam scanning desired area. The antenna elements 810A-810N may arranged in one dimension (linear) or in two dimensions to transmit the signal over desired area of interest. The beam steering unit provides N signals for each relatively shifted in phase by an angle. For example the angel may be determined based on the beam width and the swing value. In one embodiment the relative angle between the successive antennas is 20 Degrees. Thus, the antenna 810A-810N along with the beam steering unit operative together to incident a RF beam on any object by scanning the area in pattern. The antenna array 810A-810N may receive reflected RF signal (the signal reflected by an object within the scanning area) and provide the received signal to the transceiver 830. In one embodiment, the antenna array 810A-810N is multiplexed to transmit and receive. Alternatively a set of elements within the 810A-810N may be dedicated to transmitting while other set may be dedicated for receiving.

The transceiver 830 generates a signal for transmission over antenna array 810A-810N. In the transmission signal comprises unique sequence (signature) encoded and modulated by a carrier of frequency selected in the ranges of above 50 GHz The signal for transmission is provided to beam steering unit on path 823. The transceiver 830 receives plurality of signals from the antenna array 810A-810N representing the reflected signal received on the antenna array. The reflected signal is provided to the object detection unit 840.

The object detection unit 840 detects the object from the received reflected signal. The received reflected signal may be processed to determine the shape, size and proximity to the transmitter array by know signal processing techniques. For example, the each reflected signal may be measured and processed in respect of specific one or more beam directions and the time of arrival.

The beam steering unit 820 provides N phase shifted versions of the transmit signals on the respective antenna connecting path. As shown there, the beam steering unit comprises N phase shifter 820A-820N each providing different phase shift (cyclic shift) to the received transmit signal on path 823. The antenna array arrangement forms a beam and the phase shift or a delay (phase shift) steer the beam in a specific direction. In one embodiment, the delay or phase shift is dynamically changed to form scanning beam.

In one embodiment, antenna array 810A-810N, the phase shifters 820A-820N, transceiver 730 and object detection unit 840 are fabricated on a single silicon substrate as an integrated circuit. In that each phase shifter 820A-820N comprises phase shifter 500 with conductive coil segments 510 and 520, capacitors 530 and 540, resistor 550, terminals 501, 502, 591 and 592, and via path 560. The delay or phase shift of each phase shifter 820A-820N is achieved by varying R/X ratio as illustrated in FIG. 7.

In an alternative embodiment, array of phase shifters 820A-820N may be constructed with N number of phase shifter 500 on a substrate to provide independent integrated circuit device with interface to receive, phase shift control signal to adjust the phase shift of each phase shifter. The control signal may alter the value of R to dynamically provide different phase shift.

While various embodiments of the present disclosure have been described above, it should be understood that they have been presented by way of example only, and not limitation. Thus, the breadth and scope of the present disclosure should not be limited by any of the above-discussed embodiments, but should be defined only in accordance with the following claims and their equivalents.

What is claimed is:

1. An integrated circuit comprising:
   a first coil segment and a second coil segment together forming an inductor of first inductance value;
   a first capacitor of first capacitance value electrically connected parallel the inductor;
   a second capacitor of second capacitance value electrically connected between the first coil segment and the second coil segment; and
   a resistor of a first resistance value electrically connected parallel to the second capacitor,
   in that, the inductor, first capacitor, second capacitor and the resistor together operative as a phase shifter such that when an input signal of a first frequency is presented across the first capacitor, the output signal across the resistor is phase shifted version of the input signal shifted in phase by a first angle.

2. The integrated circuit of claim 1, wherein the first coil segment and second coil segments forming a loop to link maximum magnetic flux linkage between the first coil segment and the second coil segment.

3. The integrated circuit of claim 2, wherein the first coil segment and second coil segments are etched on a same metal layer in that, the overlapping part of the loop is formed on a second metal layer.

4. The integrated circuit of claim 1, wherein the first inductance value, the first capacitance value, the second capacitance value and the first resistance value are in accordance with a relation R=XC=XL, wherein the R is the first resistance value, XC is the impedance offered by each the first capacitor and the second capacitor to the input signal and the XL is the impedance offered by the inductor to the input signal.

5. An object detection system comprising:
   an antenna array for radiating radio frequency signal and receiving a signal reflected from an object;
   a transceiver operative to transmit and receive signal from the antenna array;
   signal processor to detect object from the received signal;
   a phase shifter array providing plurality of phase shifted signal; and
   a plurality of phase shifters each operative to shift phase of the transmit signal at a different phase angle to form a scanning beam of the radiating RF signal, the each phase shifter comprising a first coil segment and a second coil segment together forming an inductor of first inductance value, a first capacitor of first capacitance value electrically connected parallel the inductor, a second capacitor of second capacitance value electrically connected between the first coil segment and the second coil segment, and a resistor of a first resistance value electrically connected parallel to the second capacitor, in that, the inductor, first capacitor, second capacitor and the resistor together operative as a phase shifter such that when a input signal of a first frequency is presented across the first capacitor, the output signal across the resistor is phase shifted version of the input signal shifted in phase by a first angle.

* * * * *